United States Patent [19]
Oshima et al.

[11] Patent Number: 4,941,129
[45] Date of Patent: Jul. 10, 1990

[54] SEMICONDUCTOR MEMORY DEVICE

[75] Inventors: Kazuyoshi Oshima; Takashi Yamazaki, both of Ohme; Yasuhiro Kasama, Tokyo; Tetsu Udagawa, Tokorozawa; Hiroaki Kotani, Ohme, all of Japan

[73] Assignee: Hitachi, Ltd., Tokyo, Japan

[21] Appl. No.: 237,051

[22] Filed: Aug. 29, 1988

[30] Foreign Application Priority Data

Aug. 28, 1987 [JP] Japan .................. 62-212722

[51] Int. Cl.$^5$ .............................................. G11C 8/00
[52] U.S. Cl. ........................... 365/230.03; 365/230.02
[58] Field of Search ...................... 365/230.03, 230.02, 365/230.06, 193

[56] References Cited

U.S. PATENT DOCUMENTS 4,658,377  4/1987  McElroy ................... 365/230.03 X
4,758,993  7/1988  Takemae ................... 365/230.03 X Primary Examiner—Joseph A. Popek
Attorney, Agent, or Firm—Antonelli, Terry, Stout & Kraus

[57] ABSTRACT

A memory device is provided including a plurality of memory arrays and peripheral circuits. For example, in a dynamic RAM the peripheral circuitry will include row address decoders, column address decoders, sense amplifiers and main amplifiers disposed in such a manner as to correspond to the memory arrays, respectively. The desired row address decoders, column address decoders, sense amplifiers and main amplifiers are selectively operated in accordance with a common array selection signal generated on the basis of at least part of row address signals. Accordingly, only the row address decoders, column address decoders, sense amplifiers and main amplifiers corresponding to the memory array containing the designated memory cells are operated selectively in accordance with the common array selection signal. It is thus possible to reduce power consumption of the dynamic RAM and to simplify the structure of the peripheral circuits and wirings.

12 Claims, 5 Drawing Sheets

4,941,129

SEMICONDUCTOR MEMORY DEVICE

BACKGROUND OF THE INVENTION

This invention relates to a semiconductor memory device and to a technique which will be particularly effective when utilized for dynamic RAMs (Random Access Memories) having a plurality of memory arrays, although the invention is not limited to this.

Dynamic RAMs having a plurality of memory arrays are known. The dynamic RAM includes row address decoders, column address decoders, sense amplifiers, main amplifiers, and the like, that are disposed so as to correspond to the memory arrays.

Such a dynamic RAM having a plurality of memory arrays is described, for example, in "Hitachi IC Memory Data Book", September, 1985, pp. 263–268, published by Hitachi, Ltd.

SUMMARY OF THE INVENTION

The inventor of the present invention examined the structures of such dynamic RAMs having a plurality of memory arrays.

According to the study of the present inventor, the memory peripheral circuits (the afore-mentioned row address decoders, column address decoders, sense amplifiers, main amplifiers, etc.) disposed so as to correspond to a plurality of memory arrays are actuated selectively in accordance with an upper order complementary internal address signal $\underline{a}xi$ or $\underline{a}yi$, as shown in FIG. 3 of the accompanying drawings, for example. (Hereinafter, a non-inversion internal address signal $axi$ which has substantially the same phase as the row address signal $axi$ supplied from outside and an inversion internal address signal $\overline{axi}$ whose phase is substantially inversed to the row address signal Axi will be together expressed as the complementary internal address signal $\underline{a}xi$ in this specification.) In other words, the row address decoders RDCR0 and RDCR3 and the sense amplifiers SA0 and SA3 corresponding to the memory arrays MARY0 and MARY3 on the left side and the row address decoders RDCR1 and RDCR2 and the sense amplifiers SA1 and SA2 corresponding to the memory arrays MARY1 and MARY2 on the right side are selectively actuated in accordance with the row selection signals r0 and r1 generated on the basis of the complementary internal address signal $\underline{a}xi$ of the uppermost order, for example, respectively. The column address decoders CDCR0 and 1 corresponding to the upper memory arrays MARY0, MARY1 and the column address decoders CDCR2 and CDCR3 corresponding to the lower memory arrays MARY2 and MARY3 are actuated selectively in accordance with the column selection signal c0 and c1 generated on the basis of the complementary internal address signal $\underline{a}yi$ of the uppermost order, for example, respectively. The main amplifiers MA0-MA3 disposed so as to correspond to the memory arrays, respectively, are actuated selectively in accordance with the array selection signal a0-a3 generated on the basis of the complementary internal address signals $\underline{a}xi$ and $\underline{a}yi$.

The dynamic RAM shown in FIG. 3 is a so-called "address multiplex system" dynamic RAM. Therefore, the row address signal and the column address signal are supplied to the same external terminal. The row address signals Ax0-Axi are received in synchronism with a row address strobe signal $\overline{RAS}$ and the complementary internal address signals $\underline{a}x0-\underline{a}xi$ described above are generated on the basis of these row address signals. The column address signals Ay0-Ayi are received in synchronism with a column address strobe signal $\overline{CAS}$ and the complementary internal address signals $\underline{a}y0-\underline{a}yi$ are generated on the basis of these column address signals.

In other words, in the dynamic RAM shown in FIG. 3, predetermined row address decoders, sense amplifiers and column address decoders are selected and operated from among a plurality each of row address decoders, sense amplifiers and column decoders in accordance with part each of row address signals and column address signals. The main amplifiers of this dynamic RAM are operated selectively by the row address signal and the column address signal or their combination in accordance with the output mode of the dynamic RAM. Accordingly, even if the memory cell to be selected is only one in the read or write operation, a plurality of row address decoders, sense amplifiers and column address decoders are operated simultaneously so that lower power consumption of the dynamic RAM cannot be accomplished. The row selection signal for selecting the row address decoders, etc., the column selection signal for selecting the column address decoders, etc. and the array selection signal are generated on the basis of the row address signal, and the column address signal or their combination, and are distributed to the row address decoders, the column address decoders, the main amplifiers, etc., respectively. Therefore, the construction of the memory peripheral circuit and associated wirings for transmitting the selection signals to the respective circuits get complicated so that the reduction of cost of production of the dynamic RAM cannot be accomplished, either.

It is therefore an object of the present invention to provide a semiconductor memory device such as a dynamic RAM which reduces power consumption and cost of production.

The above and other objects and novel features and advantages of the present invention will become more apparent from the following description when taken in conjunction with the accompanying drawings.

Among the inventions disclosed herein, the following will illustrate a typical example.

Predetermined row address decoder, column address decoder, sense amplifier and main amplifier are selected from row address decoders, column address decoders, sense amplifiers and main amplifiers disposed to as to correspond to memory arrays, respectively, and operated in accordance with a common array selection signal generated on the basis of part of row address signals According to the means described above, only the row address decoder, column address decoder, sense amplifier and main amplifier corresponding to the memory array which contains the memory cell(s) designated by the address signal in the read and write operations are selected from a plurality each of row address decoders, column address decoders, sense amplifiers and main amplifiers and are operated in accordance with the common array selection signal. Accordingly, power consumption of the dynamic RAM can be reduced, the structure of the memory peripheral circuits and associated wirings can be simplified and eventually, the cost of production of the dynamic RAM can be reduced.

DESCRIPTION OF THE PREFERRED EMBODIMENTS

Figure 1:
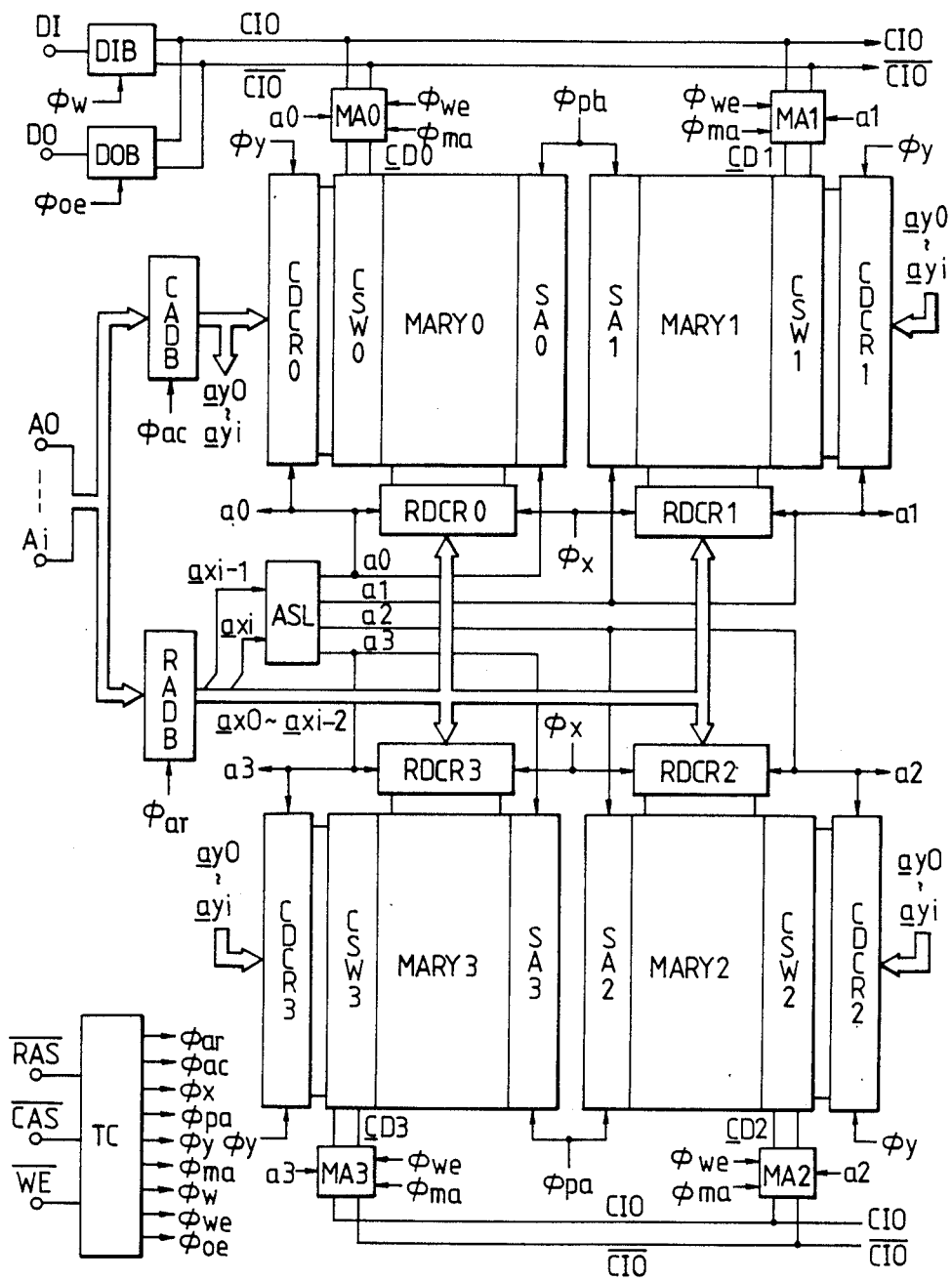
FIG. 1 is a block diagram showing a dynamic RAM in accordance with one embodiment of the present invention.

FIG. 1 is a block diagram of a dynamic RAM in accordance with the present invention. Circuit elements forming each circuit block shown in the drawing are formed on one semiconductor substrate such as a single crystal silicon substrate by known fabrication technique of semiconductor integrated circuits, though it is not particularly limited thereto.

Four memory arrays MARY0–MARY3 are disposed in the dynamic RAM of this embodiment, though the number is not particularly limitative, and four each row address decoders RDCR0–RDCR3, column address decoders CDCR0–CDCR3, sense amplifiers SA0–SA3 and column switches SCW0–CSW3 are disposed in such a manner as to correspond these four memory arrays, respectively. Complementary common data lines CD0–CD3 are disposed, too, so as to correspond to the memory arrays MARY0–MARY3, respectively. (In this specification, a non-inversion common data line CD0 and an inversion common data line $\overline{CD0}$ will be together expressed as the complementary common data line CD0.) Main amplifiers MA0–MA3 are disposed so as to correspond to these complementary common data lines.

Figure 5:
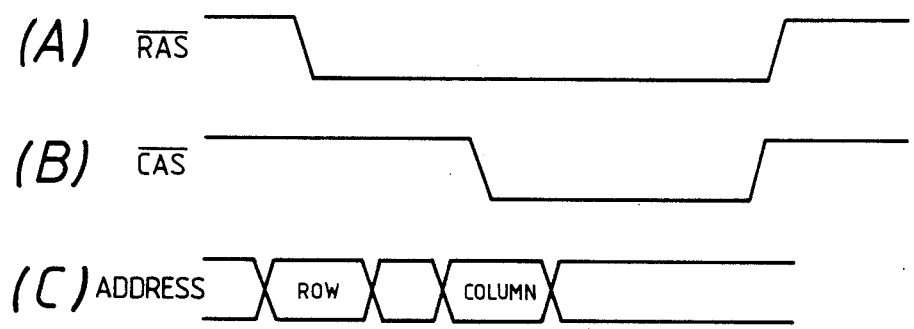
FIGS. 5(A to C) are waveform diagrams useful for explaining address multiplex.

As shown in FIGS. 5(A) to 5(C), row address signals, i.e. X address signals AX0–AXi, and column address signals, i.e. Y address signals AY0–AYi, are supplied on the time division basis through common external terminals A0–Ai. The row address signal is inputted to the dynamic RAM in synchronism with the fall of a row address strobe signal $\overline{RAS}$ while the column address signal is inputted to the dynamic RAM in synchronism with the fall of a column address strobe signal $\overline{CAS}$. Complementary internal address signals ax0–axi and ay0–ayi are generated on the basis of these address signals, respectively.

Though not particularly limitative, the upper 2-bit X address signals AXi-1 and AXi, that is, the complementary internal address signals axi-1 and axi, are supplied to an array selection circuit ASL. This array selection circuit ASL include a decoder circuit which receives these complementary internal address signals axi-1, axi and decodes them. Therefore, the array selection circuit ASL generates four kinds of array selection signals in accordance with the combinations of the potentials of the X address signals AXi-1, AXi. In other words, the array selection circuit ASL generates the array selection signals a0–a3 on the basis of the complementary internal address signals axi-1, axi.

The above-mentioned row address decoders, column address decoders, sense amplifiers and main amplifiers disposed so as to correspond to the memory arrays MARY0–MARY3 are selectively operated in accordance with the corresponding array selection signals a0–a3.

When the array selection signal a0 is selected, for example, the peripheral circuits (the row address decoder, column address decoder, sense amplifier and main amplifier) disposed for the memory array MARY0 are operated and when the array selection signal a1 is selected, for example, the peripheral circuits disposed for the memory array MARY1 are operated. When the array selection signal a2 is selected, the peripheral circuits disposed for the memory array MARY2 are operated and when the array selection signal a3 is selected, the peripheral circuits disposed for the memory array MARY3 are operated.

Though not particularly limitative, each memory array MARY0–MARY3 in FIG. 1 consists of m word lines W0–Wm-1 disposed in the vertical direction of the drawing, n sets of complementary data lines D0, $\overline{D0}$-Dn-1, $\overline{Dn-1}$ and m×n memory cells M disposed at the points of intersections between the word lines and the complementary data lines in the matrix from. These memory arrays MARY0–MARY3 have mutually the same structure, though not particularly limited thereto. The definite structure of the memory array is not shown, but since the memory array of this embodiment has the same structure as the memory mat in the later-appearing embodiments shown in FIGS. 2 and 4, refer to the embodiments for the detail of the definite structure.

Figure 4:
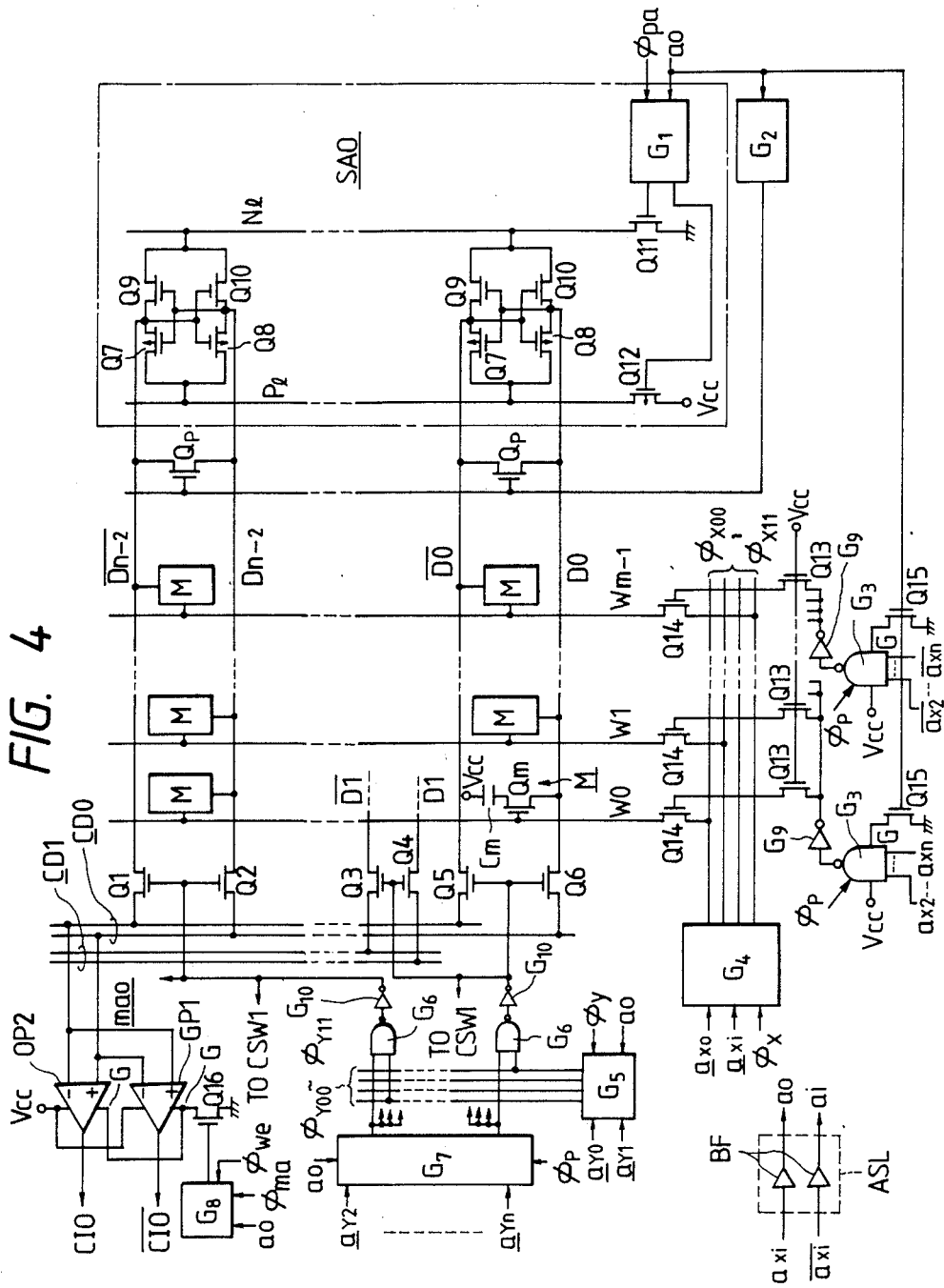
FIG. 4 is a circuit diagram of the dynamic RAM shown in FIG. 2.

As shown in FIG. 4, each memory cell M consists of a capacitor Cm for storing data and an MOSFET (insulated gate field effect transistor) Qm for selecting the address that are connected in series. As can be seen from this drawing, the input/output nodes of the m memory cells disposed in the corresponding column are alternately connected with predetermined regularity to the non-inversion data lines D0–Dn-1 and inversion data lines $\overline{D0}$–$\overline{Dn-1}$ of each complementary data line. The gates of the address selection MOSFETs Qm of the n memory cells disposed in the corresponding row are connected in common to each word line W0–Wm-1. In other words, the word line is connected to the selection node of the memory cell M.

Each word line W0–Wm-1 forming the memory array MARY0–MARY3 is connected to the corresponding row address decoder RDCR0–RDCR3 and when the corresponding row address docoder is operated, one word line is selected from a plurality of word lines W0–Wm-1 in the memory array.

The complementary internal address signals ax0–axi-2 are supplied in common from the row address buffer RADB to the row address decoder RDCR0–RDCR3 and the timing signal $\phi x$ is supplied in common from the timing control circuit TC. An array selection signal a0–a3 is supplied to the corresponding row address decoder RDCR0–RDCR3 from a later-appearing array selection signal ASL. The array selection signals a0–a3 are supplied in common to the corresponding column address decoders CDCR0–CDCR3, sense amplifiers SA0–SA3 and main amplifiers MA0–MA3.

The row address decoders RDCR0–RDCR3 are selectively operated when the timing signal described above $\phi x$ is at the high level and the corresponding array selection signals a0–a3 are at the high level. In other words, one of the row address decoders among the four row address decoders RDCR0–RDCR3 is operated by the array selection signals a0–a3 when the timing signal φx is at the high level while the rest of these row address decoders are non-operative even when the timing signal φx is at the high level. Among the row address decoders RDCR0-RDCR3, the row address decoder that is operated decodes the complementary internal address signals ax0-axi-2 supplied thereto from the row address buffer RADB. Accordingly, among a plurality of word lines of the memory array corresponding to this row address decoder, one word line designated by the complementary internal address signals ax0-axi-2 is brought into the high level selection state. At this time, in the memory arrays corresponding to the rest of row address decoders, that is, the row address decoders that are non-operative, selection of the word lines is not made.

Though not particularly limitative, the row address buffer RADB receives and holds the (i+1)-bit X address signals AX0-AXi supplied thereto through the external terminals A0-Ai and generates the complementary internal address signals /UNs/a/ x0-/UNs/a/ xi in accordance with the X address signals AX0-AXi. Though not particularly limitative, the upper two-bit complementary internal address signals axi-1 and /UNs/a/ xi among them are supplied to the array selection circuit ASL and the other complementary internal address signals /UNs/a/ x0-axi-2 are supplied in common to the row address decoders RDCR0-RDCR3.

As described above, the X (row) address signals AX0-AXi and the Y (column) address signals AY0-AYi are supplied on the time division basis through the common external terminals A0-Ai. In other words, the X address signals AX0-AXi are supplied to the external terminals A0-Ai in synchronism with the fall of the row address strobe signal $\overline{RAS}$ and the Y address signals AY0-AYi are supplied in synchronism with the fall of the column address strobe signal $\overline{CAS}$. Therefore, the timing signal φar generated by the timing control circuit TC is supplied to the row address buffer RADB. This timing signal is generated by detecting the shift of the address strobe signal /OVs/RAS/ from the high level to the low level. The timing signal φar is generated in response to this detection output. The row address buffer RADB receives the X address signals AX0-AXi in response to the timing signal φar.

The array selection signal ASL generates the array selection signals a0-a3 on the basis of the upper 2-bit complementary internal address signals axi-1 and axi supplied from the row address buffer RADB.

In the embodiment described above, the array selection circuit ASL consists substantially of the decoder circuit and decodes the complementary internal address signals axi-1, axi described above so that the resulting decoded signal is outputted as the array selection signals a0-a3 described above. As described already, these array selection signals a0-a3 are supplied in common to the row address decoders, the column address decoders, the sense amplifiers and the main amplifiers that are disposed so as to correspond to the memory arrays MARY0-MARY3, respectively.

On the other hand, each complementary data line in each memory array MARY0-MARY3 is connected at one of its ends to the corresponding unit circuit (unit sense amplifier circuit) of the corresponding sense amplifiers SA0-SA3. As will be described later in further detail with reference to FIG. 4, the corresponding array selection signal a0-a3 is supplied in common to each nit circuit of each sense amplifier SA0-SA3 from the array selection circuit ASL described above. Furthermore, the timing signal φpa is supplied in common from the timing control circuit TC to each unit circuit constituting each sense amplifier SA0-SA3.

The unit circuits in each sense amplifiers SA0-SA3 are selectively operated when the timing signal φpa is at the high level and the corresponding array selection signal a0-a3 is at the high level. In other words, among the sense amplifiers SA0-SA3, the unit circuits of the sense amplifier designated by the array selection signal are operated in response to the high level of the timing signal φpa. At this time, the unit circuits in the other sense amplifiers are non-operative. Each unit circuit in the sense amplifier which is rendered operative amplifies a very small read signal outputted to the complementary data lines from the memory cell connected to the selected word line in the corresponding memory array and generates high/low level binary read signals. In contrast, the amplification operation is not made in each unit circuit in the sense amplifiers that is rendered non-operative.

In each of the memory arrays MARY0-MARY3, each data line pair is connected at its other end to a pair of switch MOSFETs corresponding to each complementary data line pair of the column switch CSW0-CSW3 corresponding to the memory array, and is further connected selectively to the complementary common data lines CD0.$\overline{CD0}$-CD3.$\overline{CD3}$. Each of the column switches CSW0-CSW3 consists of n pairs of switch MOSFETs disposed so as to correspond to the complementary data lines of the memory array corresponding to the column switch. In each of the column switches CSW0-CSW3, the gates of the switch MOSFETs forming the pair are connected in common, and the data line selection signal corresponding to the switch MOSFETs forming the pair is supplied from the column address decoders CDCR0-CDCR3 corresponding to the column switch. These switch MOSFETs are turned ON when the corresponding data line selection signal is at the high level and connect electrically the corresponding complementary data lines connected to the switch MOSFETs to the corresponding complementary common data lines CD0.$\overline{CD0}$-CD3.$\overline{CD3}$ connected similarly to the switch MOSFETs.

The complementary internal address signals ay0-ayi are supplied in common from the column address buffer CADB to the column address decoders CDRC0-CDCR3 and furthermore, the timing signal φy is supplied in common thereto from the timing control circuit TC. The corresponding array selection signals a0-a3 are supplied from the array selection circuit ASL to the column address decoders CDCR0-CDCR3, respectively.

The column address decoders CDCR0-CDCR3 are selectively operated when the timing signal φy is at the high level and the corresponding array selection signal a0-a3 is at the high level. In other words, among the column address decoders CDCR0-CDCR3, the column decoder designated by the array selection signal a0-a3 (e.g. the decoder CDCR0) is rendered operative when the timing signal φy is at the high level. At this time, the rest of the column address decoders (CDCR1-CDCR3) are non-operative even though the timing signal φy is at the high level.

The column address decoder (CDCR0) which is rendered operative decodes the complementary internal address signals ay0-ayi and sets the data line selection signal designated by the complementary internal address signal ar0-ari at that time, among the data selection signals described above, to the high level which corresponds to the selection state, and the rest of the data line selection signals to the low level which corresponds to the non-selection state. In contrast, the column address decoders (CDCR1-CDCR3) which are rendered non-operative generate the low level data line selection signals which are under the non-selection state. As described already, these data line selection signals are supplied to the corresponding pair of switch MOSFETs of the corresponding column switches CSW0-CSW3, respectively.

The column address buffer CADB receives and holds the Y address signals AY0-AYi supplied thereto through the external terminals A0-Ai, generates the complementary internal address signals ay0-ayi on the basis of these Y address signals AY0-AYi and supplies them in common to the column address decoders CDCR0-CDCR3 described above. As described already, the dynamic RAM of this embodiment employs the address multiplex system and the Y address signals AY0-AYi are supplied to the external terminals A0-Ai in synchronism with the fall of the column address strobe signal $\overline{CAS}$. Therefore, the timing signal $\phi ac$ which is generated by detecting the fall of the column address strobe signal $\overline{CAS}$ is supplied to the column address buffer CADB from the timing control circuit TC. The column address buffer CADB responds to this timing signal $\phi ac$ and receives the Y address signals AY0-AYi.

The timing signals $\phi we$ and $\phi ma$ are supplied in common to the main amplifiers MA0-MA3 from the timing control circuit TC and the corresponding array selection signals a0-a3 are supplied thereto from the array selection circuit ASL described above.

When the dynamic RAM is in the write mode, the timing signal $\phi we$ is at the high level. If any of the array selection signals a0-a3 is at the high level under this state, the main amplifier (e.g. MA0) among the main amplifiers which is made operative in this manner transmits as such the write signal supplied from the data input buffer DIB through the complementary common input/output lines CI0.$\overline{CI0}$ to the corresponding complementary common data lines (CD0-$\overline{CD0}$). At this time, the rest of the main amplifiers (MA1-MA3) are rendered non-operative.

On the other hand, when the dynamic RAM is in the read mode, the timing signal $\phi ma$ described above is at the high level. When any of the array selection signal a0-a3 is set to the high level, the main amplifier among the main amplifiers MA0-MA3 which corresponds to the high level selection signal (e.g. MA0) is selectively rendered operative.

The main amplifier (e.g. MA0) thus operated further amplifies the binary read signal outputted from the corresponding memory array (MARY0) through the corresponding complementary common data lines (CD0.$\overline{CD0}$) and transmits it through the complementary common input/output lines CI0.$\overline{CI0}$ to the data output buffer DOB.

Though the description given above uses the main amplifier (MA0) by way of example, the operation is the same when each of the other main amplifiers (MA1-MA3) is operated. Note, however, that the memory array and the complementary common data lines are those which correspond to the main amplifier that is rendered operative.

The input terminal of the data input buffer DIB is connected to the data input terminal DI. Its output terminal is connected to the complementary common input/output lines CI0.$\overline{CI0}$. The timing signal $\phi w$ is supplied from the timing control circuit TC to the data input buffer DIB.

The data input buffer DIB is selectively operated when the timing signal $\phi w$ is at the high level. Under this operative state, the data input buffer DIB generates the complementary write signal on the basis of the write data supplied thereto through the data input terminal DI and transmits it to the complementary common input/output lines CI0.$\overline{CI0}$ These complementary write signals are transmitted selectively to the selected memory cell of the memory array among the memory arrays MARY0-MARY3 that corresponds to the operative main amplifier among the main amplifiers MA0-MA3 that is rendered operative.

The input terminal of the data output buffer DOB is connected to the complementary complementary input/output lines CI0.$\overline{CI0}$. The output terminal is also connected to the data output terminal. The timing signal $\phi oe$ is supplied from the timing control circuit TC to this data output buffer DOB.

The data output buffer DOB is rendered operative selectively when the timing signal $\phi oe$ is at the high level. Under this operative state, the data output buffer DOB further amplifies the read signal outputted from the selected memory cell through the complementary common input/output lines CI0.CI0 and transmits it to the outside through the data output terminal D0.

The timing control circuit TC generates the various control signals described above on the basis of the row address strobe signal $\overline{RAS}$, column address strobe signal $\overline{CAS}$ and write enable signal $\overline{WE}$ supplied thereto from outside as the control signals, and supplies them to the respective circuits.

As described above, four memory arrays MARY0-MARY3 are disposed in the dynamic RAM of this embodiment, and the row address decoders RDCR0-RDCR3, the column address decoders CDCR0-CDCR3, the sense amplifiers SA0-SA3 and the main amplifiers MA0-MA3 are disposed so as to corresponds to these memory arrays. In the dynamic RAM, there is further disposed the array selection circuit ASL for forming the array selection signals a0-a3 on the basis of the upper 2-bit row address signals, that is, the complementary internal address signals axi-1 and UNs/a/ xi. The row address decoder, column address decoder, sense amplifier and main amplifier corresponding to each memory array are selectively operated when the corresponding common array selection signal a0-a3 is at the high level. In other words, in the dynamic RAM of this embodiment, the row address decoder, column address decoder, sense amplifier and main amplifier corresponding to only one memory array which contains the memory cells designated in the read and write operations are selectively operated and the row address decoders, column address decoders, sense amplifiers and main amplifiers corresponding to the remaining three memory arrays are not operated (or rendered non-operative). It is thus possible to reduce power consumption of the dynamic RAM and to reduce its cost of production by simplifying the structures of peripheral circuits.

Figure 2:
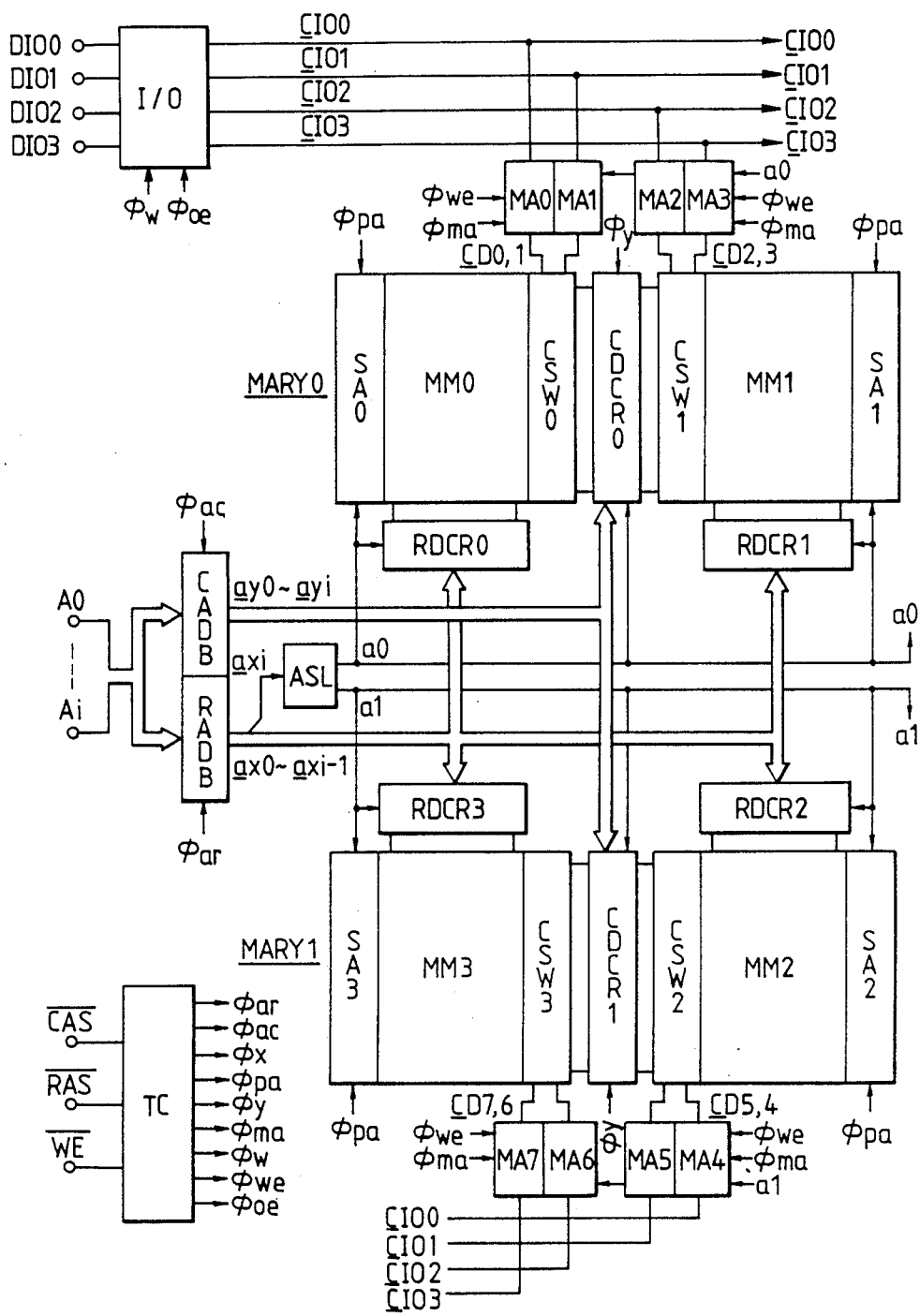
FIG. 2 is a block diagram of the dynamic RAM in accordance with another embodiment of the present invention.

FIG. 2 is a block diagram showing the dynamic RAM in accordance with another embodiment of the present invention. The circuit elements constituting each circuit block in the drawing are formed on one semiconductor substrate such as a single crystal silicon substrate in the same way as in the embodiment shown in FIG. 1.

Two column address decoders CDCR0 and CDCR1 are disposed in the dynamic RAM of this embodiment and memory mats MM0 and MM1 and the memory mats MM2 and MM3 are disposed in such a manner as to interpose these column address decoders between them. Row address decoders RDCR0-RDCR3, sense amplifiers SA0-SA3 and column switches SCW0-CSW3 are disposed in such a manner as to correspond to these memory mats MM0-MM3 in the dynamic RAM of this embodiment. Though not particularly limitative, there is further disposed an array selection circuit ASL for selectively generating array selection signals a0 and a1 on the basis of the X address signal AXi of the uppermost order, that is, a complementary internal address signal axi.

In this embodiment, the column address decoder CDCR0, the memory mats MM0, MM1 and the row address decoders RDCDR0, RDCR1 and sense amplifiers SA0, SA1 corresponding to these memory mats are selectively operated in accordance with the array selection signal a0. Similarly, the column address decoder CDCR1, the memory mats MM2, MM3 and the row address decoders RDCR2, RDCR3 and sense amplifiers SA2, SA3 corresponding to these memory mats are selectively operated in accordance with the array selection signal a1. Under their operative state, one word line is selected simultaneously from the memory mats MM0 and MM1 (or MM2 and MM3) and two complementary data line pairs are simultaneously selected from the respective memory mats. Accordingly, four, in total, of memory cells are selected simultaneously from any pair of memory mats MM0, MM1 (or MM2, MM3) and connected to the corresponding complementary common data lines $\overline{CD0}$-$\overline{CD3}$ (or $\overline{CD4}$-$\overline{CD7}$). Four-bit memory data are simultaneously inputted and outputted to and from these selected four memory cells through the main amplifiers MA0-MA3 (or MA4-MA7) which are selectively operated in accordance with the array selection signals a0 and a1 and through data input/output terminals DIO0-DIO3.

In this embodiment, the memory mats MM0-MM3 and their peripheral circuits correspond to the memory arrays MARY0-MARY4 and their peripheral circuits in the embodiment shown in FIG. 1, respectively, and have the same functions. Hereinafter, only the difference of the dynamic RAM of this embodiment from that of the embodiment shown in FIG. 1 will be described.

In FIG. 2, n complementary data line pairs constituting the memory mat MM0 (MM1) are connected to the corresponding unit circuits inside the corresponding sense amplifier group SA0 (SA1) on one hand and connected to a pair of corresponding switch MOSFETs inside the corresponding column switch CSW0 (CSW1). In the column switch CSW0 (CSW1), the input/output electrodes of one of two mutually adjacent pairs of switch MOSFETs are connected to two complementary data line pairs adjacent to each other, and the other of the input/output electrodes are connected alternately and commonly to the noninversion common data lines CD0, CD1 (CD2, CD3) and inversion common data lines $\overline{CD0}.\overline{CD1}.\overline{CD2}.\overline{CD3}$ (see FIG. 4). The gates of these two pairs of switch MOSFETs adjacent to each other are connected in common and the corresponding data line selection signal is supplied to them from the column address decoder CDCR0.

Similarly, n complementary data lines constituting the memory mat MM2 (MM3) are connected, on one hand, to the corresponding unit circuits inside the corresponding sense amplifier group SA2 (SA3) and on the other hand, to a corresponding pair of switch MOSFETs inside the corresponding column switch CSW2 (CSW3). In the column switch CSW2 (CSW3), the input/output electrodes of one of two pairs of switch MOSFETs adjacent to each other are connected to two complementary data line pairs adjacent to each other and the input/output electrodes of the other are connected alternately and in common to the non-inversion common data lines CD4, CD5 (CD6, CD7) of the complementary common data lines CD4.CD5 ($\underline{CD6}.\underline{CD7}$) and to the inversion common data lines $\overline{CD4}$, $\overline{CD5}$ ($\overline{CD6}.\overline{CD7}$). The gates of two pairs of switch MOSFETs adjacent to each other are connected in common and the corresponding data line selection signal is supplied to them from the column address decoder CDCR1.

The two pairs of the switch MOSFETs adjacent to each other inside the column switches CSW0, CSW1 or CSW2, CSW3 are turned ON selectively when the corresponding data line selection signals are at the high level and connect selectively the corresponding two pairs of complementary data lines and complementary common data lines $\overline{CD0}.\overline{CD1}$-$\overline{CD6}.C7$. In other words, the gates of two sets of switch MOSFETs which are adjacent to each other inside the column switch CSW0 (CSW2) and whose gates are connected mutually are connected to the gates of two sets of switch MOSFETs which are adjacent to each other in the column switch CSW1 (CSW3) and whose gates are connected mutually. Namely, the data line selection signals outputted from the column address decoder CDCR0 (CDCR1) are supplied to the gates of two sets of switch MOSFETs in the column switch CSW0 (CSW2) and to the gates of two sets of column switch CSW1 (CSW3). Therefore, when the high level data line selection signal is outputted from the column address decoder CDCR0 (CDCR1), the two sets of switch MOSFETs in the column switch CSW0 (CSW2) corresponding to this data line selection signal and the two sets of switch MOSFETs in the column switch CSW1 (CSW3) corresponding thereto are turned ON, so that the two sets of complementary data line pairs in the memory mat MM0 (MM2) are connected to the corresponding two sets of complementary common data lines $\overline{CD0}$, $\overline{CD1}$ ($\overline{CD4}$, $\overline{CD5}$) and the two sets of complementary data line pairs in the memory mat MM1 (MM4) are connected to the corresponding two sets of complementary common data lines $\overline{CD2}$, $\overline{CD3}$ ($\overline{CD6}$, $\overline{CD7}$), respectively.

The complementary internal address signals ay0-ayi are supplied in common from the column address buffer CADB to the column address decoders CDCR0 and CDCR1 and the corresponding array selection signals a0 and a1 are supplied thereto from the array selection circuit ASL. The column address decoders CDCR0 and CDCR1 are operated selectively in accordance with the array selection signals a0 and a1.

Though not particularly limitative, the array selection circuit ASL generates selectively the array selection signals a0 and a1 described above in accordance with the complementary internal address signal axi of the uppermost order that is supplied from the row address buffer RADB. Among them, the array selection signal a0 is supplied in common to the column address decoder CDCR0 and the row address decoders RDCR0, RDCR1, sense amplifiers SA0, SA1 and main amplifiers MA0, MAL that correspond to the column address decoder CDCR0. Similarly, the array selection signal a1 is supplied in common to the column address decoder CDCR1 and to the row address decoders RDCR2, RDCR3, sense amplifiers SA2, SA3 and main amplifiers MA2, MA3 that correspond to the column address decoder CDCR1. The complementary internal address signals /UNs/a/ x0–axi-1 other than the uppermost bit are supplied in common to the row address decoders RDCR0–RDCR3.

The array selection circuit ALS consists, for example, of a buffer circuit which receives the internal address signal axi and generates an output signal in accordance with this internal address signal axi and a buffer circuit which receives the internal address signal axi and generates an output signal in accordance with this signal axi. The output signals of these buffer circuits are supplied as the array selection signals a0, a1 to each circuit.

The complementary common data lines $\overline{CD0}$–CD3 are connected to the corresponding main amplifiers MA0–MA3, respectively. The main amplifiers MA0–MA3 are further connected to the corresponding complementary common input/output lines $\overline{CIO0}$–CIO3, respectively. The timing signals $\phi$we and $\overline{\phi}$ma are supplied in common from the timing control circuit TC to these main amplifiers MA0–MA3, respectively. (These timing signals are a timing signal which distinguishes the read operation and the write operation of the dynamic RAM, and a timing signal which defines the operation timing of the main amplifier, respectively.) Furthermore, the array selection signal a0 is supplied in common to the main amplifiers MA0–MA3 from the array selection circuit ASL. Each of the main amplifiers MA0–MA3 is operated simultaneously when the timing signal $\phi$we or $\overline{\phi}$ma is at the high level and moreover, when the array selection signal a0 is at the high level.

Similarly, the complementary common data lines CD4–CD7 are connected to the corresponding main amplifiers MA4–MA7, respectively. These main amplifiers MA4–MA7 are further connected to the corresponding complementary common input/output lines $\overline{CIO0}$–CIO3, respectively. The timing signals $\phi$we and $\overline{\phi}$ma are supplied in common to the main amplifiers MA4–MA7 from the timing control circuit TC, and the array selection signal a1 is supplied in common to them from the array selection circuit ASL. Each of the main amplifiers MA0–MA3 is operated simultaneously when the timing signal $\phi$we or $\phi$ma is at the high level and moreover, when the array selection signal a1 is at the high level.

Each of the complementary common input/output lines $\overline{CIO0}$–CIO3 is connected to the corresponding unit input/output circuit in the input/output circuit I/O and further to the corresponding data input/output terminal DIO0–DIO3 through the corresponding unit input/output circuit. Each unit input/output circuit in the input/output circuit I/O includes a data input buffer DIB having its output terminal connected to the corresponding common input/output line and its input terminal connected to the corresponding data input/output terminal, and a data output buffer DOB having its output terminal connected to the corresponding data input/output terminal and its input terminal connected to the corresponding common input/output line. These data input and output buffers DBI and DOB correspond to the data input buffer DIB and data output buffer DOB in the embodiment shown in FIG. 1, respectively. However, since the input terminal of data and output terminal of data are common in this embodiment, the data output buffer enters the high impedance output state when the dynamic RAM is in the write mode. Needless to say, the output of the data input buffer DIB in the embodiments shown in FIGS. 1 and 2 is at the high impedance when the dynamic RAM is under operation.

As described above, when the array selection signal a0 is at the high level, the column address decoder CDCR0 and the row address decoders RDCR0, RDCR1, sense amplifiers SA0, SA1 and main amplifiers MA0–MA3 corresponding to the column address decoder are operated substantially simultaneously. Under this operative state, four, in all, or memory cells are selected from the memory mats MM0 and MM1 and are connected to the corresponding complementary common data lines $\overline{CD0}$–CD3, respectively. Four-bit memory data are inputted and outputted to and from these memory cells in parallel with one another through the corresponding data input/output terminals DI00–DI03 when the main amplifiers MA0–MA3 are operated substantially simultaneously with one another Similarly, when the array selection signal a1 is at the high level, the column address decoder CDCR1 and the row address decoders RDCR2, RDCR3, sense amplifiers SA2, SA3 and main amplifiers MA4–MA7 corresponding to the column address decoder are operated substantially simultaneously. Under this operative state, four in all of memory cells are selected from the memory mats MM2 and MM3 and are connected to the corresponding complementary common data lines $\overline{CD4}$–CD7, respectively. Since the main amplifiers $\overline{MA4}$–MA7 are operated substantially simultaneously with one another, four-bit memory data are inputted and outputted in parallel with one another to and from these memory cells through the corresponding data input/output terminals DI00–DIO3.

As described above, in the dynamic RAM of this embodiment, there are disposed two column address decoders CDCR0 and CDCR1 and the memory mats MM0, MM1 and MM2, MM3 are disposed in such a manner as to interpose the column address decoders between them. The dynamic RAM in this embodiment further includes one each of row address decoder and sense amplifier group so as to correspond to each memory mat and two main amplifiers. The column address decoder CDCR0 (CDCR1), two row address decoders RDCR0, RDCR1 (RDCR2, RDCR3) corresponding to the memory mats MM0, MM1 (MM2, MM3) corresponding to this column address decoder, the sense amplifier groups SA0, SA1 (SA2, SA3) and four main amplifiers MA0–MA3 (MA4–MA7) are operated when the common array selection signal a0 (a1) generated on the basis of the row address signal of the uppermost order is at the high level. In other words, in the dynamic RAM of this embodiment, the column address decoder that corresponds to the memory mat containing the memory cells designated so as to make data input/output in the read and/or write operation, the two row address decoders and sense amplifier groups corresponding to this memory mat and four main amplifiers are operated. The column address decoders corresponding to the memory mats not containing the memory cells for making the data input and output, two each row address decoders and sense amplifiers groups corresponding to this column address decoder and four main amplifiers are not operated (under the non-operative state). It is thus possible to reduce power consumption of the dynamic RAM, to simplify the structure of the memory peripheral circuits and associated wirings and to reduce the cost of production of the dynamic RAM.

FIG. 4 shows a definite example of the dynamic RAM shown in FIG. 2 and represents the portion that corresponds to the memory mat MM0 in the dynamic RAM shown in FIG. 2.

In the drawing, symbols D0, $\overline{D0}$–Dn-1, $\overline{Dn-1}$ represent complementary data lines constituting a memory mat MM0 and the complementary data lines D0, $\overline{D0}$ and Dn-2, $\overline{Dn-2}$ are shown in detail as their examples. As described in the foregoing embodiments, each complementary data line D0, $\overline{D0}$–Dn-1, $\overline{Dn-1}$ is disposed in such a manner as to cross each word line W0–Wn-1 and a memory cell is disposed at the point of inter-section between the word line and either one of the data lines of a pair of complementary data lines. As shown in the drawing, the memory cells M are disposed in the matrix form at the points of intersection between the data lines and the word lines with predetermined regularity. In the drawing, a definite circuit diagram of one memory cell M is illustrated as a representative. Each memory cell C consists of a storage capacitor Cm for storing data as a charge and an address selection MOSFET Qm connected in series between the data storage capacitor Cm and the data line and having its gate connected to the word line.

A pair of input/output nodes and a pair of switch MOSFETs of a unit sense amplifier circuit are connected to each complementary data line pair D0, $\overline{D0}$–Dn-1, $\overline{Dn-1}$ Each unit sense amplifier circuit includes a CMOS invertor consisting of a P-channel MOSFET Q7 and an N-channel MOSFET Q9 and a CMOS invertor consisting of a P-channel MOSFET Q8 and an N-channel MOSFET Q10 and the input nodes and output nodes of these CMOS invertors are mutually cross-connected to form the unit sense amplifier circuit. The sources of the N-channel MOSFETs Q9 and Q10 are connected to a common potential line Nl while the sources of the P-channel MOSFETs Q7 and Q8 of each unit sense amplifier circuit are connected to a common potential line Pl. N- and P-channel MOSFETs Q11 and Q12 are connected between the common potential lines Nl, Pl and power sources Vss, Vcc, respectively. A sense amplifier activation signal generated by a timing siganl generation circuit G1 is supplied to the gates of these MOSFETs Q11, Q12, respectively. This timing signal generation circuit receives the afore-mentioned timing signal $\phi$pa and array selection signal a0, supplies the high level sense amplifier activation signal to the gate of the MOSFET Q11 and the low level sense amplifier activation signal to MOSFET Q12 when the array selection signal a0 is at the high level (designates the selection of the memory mat MM0) and the sense amplifier timing signal $\phi$pa is also at the high level. Therefore, MOSFETs Q11 and Q12 are turned ON and each unit sense amplifier circuit amplifies the potential difference between a pair of input/output nodes. On the other hand, when at least one of the timing signal $\phi$pa and the array selection signal a0 is at the low level, the timing signal generation circuit G1 holds the signal supplied to the gate of MOSFET Q11 at the low level and the signal supplied to the gate of MOSFET Q12 at the high level. Accordingly, each unit sense amplifier circuit is kept under the nonoperative state.

As described above, the sense amplifier group SA0 consists of a plurality of unit sense amplifier circuits, the common potential lines Pl, Nl, the MOSFETs Q11, Q12 for activating the sense amplifiers and the timing signal generation circuit G1, for example. However, it is possible to employ the structure wherein each of the MOSFETs Q11 and Q12 for activating the sense amplifiers is composed of two MOSFETs and their ON timings are different from one another. According to this structure, it becomes possible to prevent the large drop of the potential of the data lines when the unit sense amplifier circuit starts operating.

As to the switch MOSFETs constituting the column switch CSW0, the other input/output electrodes of the switch MOSFETs Q5, Q6 one of the input/output electrodes of which are connected to the complementary data line pair D0, $\overline{D0}$ are connected to the common complementary data line CD0, and the other of the input/output electrodes of the switch MOSFETs Q3, Q4 one of the input/output electrodes of which are connected to the complementary data line pair D1, $\overline{D1}$ disposed next are connected to the common complementary data line CD1. The gates of these switch MOSFETs Q3 to Q6 are connected mutually and the selection signal from the column decoder CDCR0 is supplied to them. Accordingly, when the complementary data line pair D0, D0 are connected to the common complementary data line UNs/C/ D0 through the switch MOSFETs, the complementary data line pair D0, $\overline{D0}$ and the complementary date line pair D1, $\overline{D1}$ adjacent to the former are connected to the common complementary data line CD1 through the switch MOSFETs. As a result, 2-bit parallel read and write can be made to and from the memory mat MM0 in the write and read operation.

The row address decoder RDCR0 can be regarded as being composed substantially of two kinds of decoder circuits The first decoder circuit consists of a decoder circuit G4 which receives the complementary internal address signals axo, axi of the row system and generates four kinds of selection timing signals $\phi$x00–$\phi$x11. This decoder circuit G4 decodes the complementary internal address signals axo, axl and outputs the four decoded signals obtained by this decoding operation as the selection timing signals $\phi$x00–$\phi$x11 in synchronism with the timing signal $\phi$x described above. The second decoder circuit consists of a plurality of unit decoder circuits having mutually the same structure. Each unit decoder circuit consists of an NAND gate G3 for receiving the internal address signals ax2–axn of the row system, an invertor G9 for inversing the phase of the output signal of the NAND gate G3, four cut MOSFETs Q13 whose gates are connected to the power source Vcc and MOSFETs Q14 one of the electrodes of each of which is connected to the word line W0–W3 and the other electrode of each of which receives the selecting timing signal $\phi$x00–$\phi$x11 described above. The unit decoder circuit further includes a switch MOSFET Q15 whose drain-source path is interposed between the ground potential node G of the NAND gate G3 and the ground potential point of the circuit and the gate of which receives the array selection signal a0. The NAND gate G3 consists of a ratio-less type NAND gate. It is first pre-charged by the high level of a pre-charge signal $\phi$p and the output signal of the NAND gate is at the high level. The other unit decoder circuits have the same structure as described above, but the combination of the internal address signals supplied to the NAND gate G3 is different from each unit decoder circuit to unit decoder circuit.

When the array selection signal a0 is at the high level, the ground potential Vss of the circuit is supplied to the ground potential node G of the NAND gate G3 through the switch MOSFET Q15. Therefore, the NAND gate G3 becomes operative and when all the internal address signals supplied thereto are at the high level, it generates a low level output. Accordingly, the MOSFET Q14 to which the output signal of the NAND gate G3 is supplied through the invertor G9 and the cut MOSFET Q13 is turned ON. When the high level selection timing signal $\phi x00$, for example, is outputted from the first decoder circuit G4, the high level potential is applied as the selection potential of the word line to the word line (e.g. W0) through the MOSFET Q14 that is turned ON, and the word line (W0) is thus selected. At this time, since at least one of the internal address signals supplied to the NAND gate G3 is at the low level, the MOSFETs Q14 in the other unit decoder circuits are OFF and the high level selection signal is not applied to the word line.

On the other hand, when the array selection signal a0 is at the low level, the ground potential Vss of the circuit is not applied to the ground potential node of the NAND gate G3. Therefore, the NAND gate G3 is not operative and its output keeps the high level at the time of pre-charge irrespective of the potential of the internal address signal supplied thereto. Accordingly, all the MOSFET Q14 in the row decoder RDCR0 are turned OFF and no word line of the memorymat MM0 is selected.

In the same way as the row address decoder RDCR0 described above, the column address decoder CDCR0, too, can be regarded as being composed substantially of two kinds of decoder circuits. The first decoder circuit consists of a decoder circuit G5 which receives the complementary internal address signals ayo, ay1 of the column system, the selection timing signal $\phi r$ and array selection signal described above. When the array selection signal a0 is at the high level, this decoder circuit G5 decodes the complementary internal address signals ay0, ar1 and outputs the four decoded signals obtained by this decoding operation as the selection timing signals $\phi y00$–$\phi y11$ in synchronism with the timing signal $\phi y$. The second decoder circuit consists of a plurality of unit decoder circuits having mutually the same structure. Each unit decoder circuit consists, for example, of a NAND gate for receiving the column system internal address signals ay2–ayn and an invertor for inversing the phase of the output of this NAND gate and generating an output signal of each unit decoder circuit. This NAND gate consists, for example, of a ratio-less type NAND gate in the same way as the NAND gate G3 described above, and its ground potential node is connected to the ground potential point of the circuit through a switch MOSFET similar to the switch MOSFET Q15 described above.

The array selection signal a0 is applied to the gate of this switch MOSFET in the same way as MSOFET Q15 described above. Though the unit decoder circuits have mutually the same structure as described above, the combination of the column system internal address signals supplied to them is different between them. The output signal of each unit decoder circuit is supplied in common to one of the input nodes of each of the four NAND gates G6. The selection signal $\phi 00$–$\phi y11$ which is mutually different is supplied to the other input nodes of each NAND gate G6. The output signal of each NAND gate G6 is subjected to phase inversion by the invertor G10, and the output signal is supplied as the data line selection signal to the column switch CSW0, CSW1. As can be seen from the drawing, each of the data line selection signals is supplied to the gates of two sets os switch MOSFETs (e.g. Q3, Q4 and Q5, Q6) of the column switch CSW0 and to the gate of two sets of MOSFETs (not shown) of the column switch SCW1.

The NAND gate of each unit decoder circuit in the second decoder circuit G7 is pre-charged in advance by the pre-charge signal $\phi p$. When the array selection signal a0 is at the high level, the ground potential Vss of the circuit is applied to the ground potential node of the NAND gate of each unit decoder circuit. Therefore, the NAND gate generates a low level output signal when all the internal address signals applied thereto are at the high level. In response thereto, the unit decoder circuit containing this NAND gate outputs a high level output signal. This high level output signal is supplied to the four NAND gates G6. For example, the high level output signal is supplied to the NAND gates G6 depicted at the lower part in the drawing. When the high level selection timing signal $\phi y11$, for example, is outputted from the first decoder circuit G5 at this time, the switch MOSFETs Q3–Q6 in the column switch CSW0 are turned ON and the complementary data lines D0, $\overline{D0}$ D1, $\overline{D1}$ are connected to the corresponding common complementary data lines CD0, CD1 through these switch MOSFETs. At this time, the high level selection signal is supplied from the column address decoder CDCR0 to the column switch CSW1, too, and two sets of complementary data lines in the memory mat MM1 are connected electrically to two sets of common complementary data lines CD2, CD3. At this time, each of the other unit decoder circuits in the column address decoder CDCR0 generates the high level output signal so that in the column switches CSW0, CSW1, the low level selection signal is supplied to the switch MOSFETs other than the above-mentioned switch MOSFET and the complementary data line pairs other than the four sets of complementary data line pairs described above are not connected electrically to the common complementary data lines CD0–CD3.

In contrast, when the array selection signal $\overline{a0}$ is at the low level, the ground potential Vss of the circuit is not supplied to the ground potential nodes G of the NAND gates in each unit decoder circuit in the column address decoder CDCR0 Therefore, these NAND circuits keep the pre-charged state and their output signals remain at the high level. Therefore, the data line selection signals outputted from the column address decoder are all at the low level and all the switch MOSFETs in the column switches CSW0, CSW1 are turned OFF.

Though not particularly limitative, an MOSFET which is turned ON by the low level array selection signal is disposed in the decoder circuit G5 between each signal line for transmitting the selection timing signal $\phi y0$–$\phi y11$ and the ground potential of the circuit, and prevents the output of an undesired selection timing signal when the memory mat MM0, MM1 is non-operative. This structure can also be used in the decoder G4 described already.

In the drawing, symbol mao represents a main amplifier portion which amplifies the memory cell data supplied through the common complementary data line CD0. This main amplifier portion ma0 is contained in the main amplifier MA0 described already. Similar main amplifier portions are disposed, too, in the other main amplifiers MA1-MA7, respectively.

Each main amplifier portion includes two differential amplifier circuits OP1, OP2, a MOSFET Q16 having its source-drain path connected between the ground potential node of each differential amplifier circuit and the ground potential point of the circuit and a control signal generation circuit G8 which receives the aforementioned timing signals φwe, φma and array selection signal a0 and controls the ON/OFF of the MOSFET Q16 described above. When the timing signals φma, φwe are at the high level and the memory selection signal is also at the high level, this control signal generation circuit supplies a high level control signal to the MOSFET Q16 described above. Therefore, the ground potential of this circuit is supplied to the ground potential node of each amplifier circuit OP1, OP2 through this MOSFET Q16, and in response thereto, each differential amplifier circuit OPq, OP2 becomes operative, amplifies the potential difference between the common complementary data lines $\overline{CD0}$ and sends the amplified signals to the input/output lines CI0, $\overline{CI0}$. When the array selection signal a0 is at the low level, on the other hand, the control signal generation circuit G8 supplies the low level control signal to the gate of MOSFET Q16. Therefore, the MOSFET Q16 is turned OFF and the ground potential Vss is not supplied to the ground potential node of each differential amplifier circuit OP1, OP2 so that the main amplifier portion ma0 is non-operative. The constant current source inside each differential amplifier circuit OP1, OP2 may be controlled by the control signal described above in place of the MOSFET Q16 described above. In other words, it is possible to employ the structure wherein a predetermined constant current is generated by the constant current source when the control signal is at the high level but is not generated when the control signal is at the low level. Such a constant current source can be composed of an N-channel MOSFET, for example.

In the drawing, symbol Qp represents a pre-charge MOSFET for the data line. This pre-charge MOSFET is controlled by the pre-charge control signal generated by the timing signal generation circuit G2 that receives the array selection signal a0. In other words, this pre-charge MOSFET Qp is turned ON after the unit sense amplifier circuit makes the amplification operation so that one of the data lines is at the high level (Vcc) with the other being at the low level (Vss) and the MOSFETs Q12, Q11 for activating the sense amplifier are turned OFF. The pre-charge MOSFET Qp is turned OFF before one of the word lines among the word lines W0-Wm-1 is selected. Accordingly, each data line is pre-charged to a potential which is substantially at an intermediate level between Vcc and Vss. In this dynamic RAM, since each data line is pre-charged to the intermediate potential between Vcc and Vss, the potential of this pre-charged data line can be utilized as a reference potential when reading the data out from the memory cell. Therefore, it is possible to eliminate a so-called "dummy cell" circuit for generating a reference potential.

Since the pre-charge of the data line is made by means of short-circuit of the complementary data lines forming a pair, the pre-charge potential of each data line might drop due to a leakage current or the like. To prevent this problem, there are disposed a reference voltage generation circuit (not shown) for generating a potential VH corresponding to the intermediate potential described above and MOSFETs whose source-drain paths are connected between the output node of the reference potential generation circuit and the data lines, respectively, and whose gates receive the pre-charge signal so that the reference potential VH can be supplied to each data line through MOSFET, now shown The timing signal generation circuit G2 sets the pre-charge signal to the low level in response to the change of the array selection signal a0 to the high level. According to this structure, when a memory cell is selected from the memory mat MM), MM1, each data line in the memory mat MM2, MM3 is under the pre-charge state and it is thus possible to prevent an undesirable change of the pre-charge potential of the data lines in the non-selected memory mat.

The array selection circuit SL in this embodiment consists of two buffer circuits BF, though not particularly limited thereto. One of the buffer circuits BF receives the row system internal address signal axi and outputs a signal corresponding thereto as the array selection signal a0 while the other buffer circuit BF receives the row system internal address signal $\overline{axi}$ and outputs a signal corresponding thereto as the array selection signal a1.

FIG. 4 shows principally the memory mat MM0 and its peripheral circuits with the other memory mats MM1-MM3 and their peripheral circuits being omitted. The memory mat MM1 and its peripheral circuit are substantially the same as the memory mat MM0 and its peripheral circuit shown in FIG. 4. Similarly, the memory mat MM2 (MM3) and its peripheral circuit are the same as the memory mat MM1 and its peripheral circuit. Note, however, the array selection signal a1 is supplied to the memory mats MM2, MM3 and their peripheral circuits in place of the array selection signal a0 described above.

In each of the foregoing embodiments, the row address decoder includes the drive circuit of word lines as can be seen from FIG. 4, though not described in particular.

Figure 3:
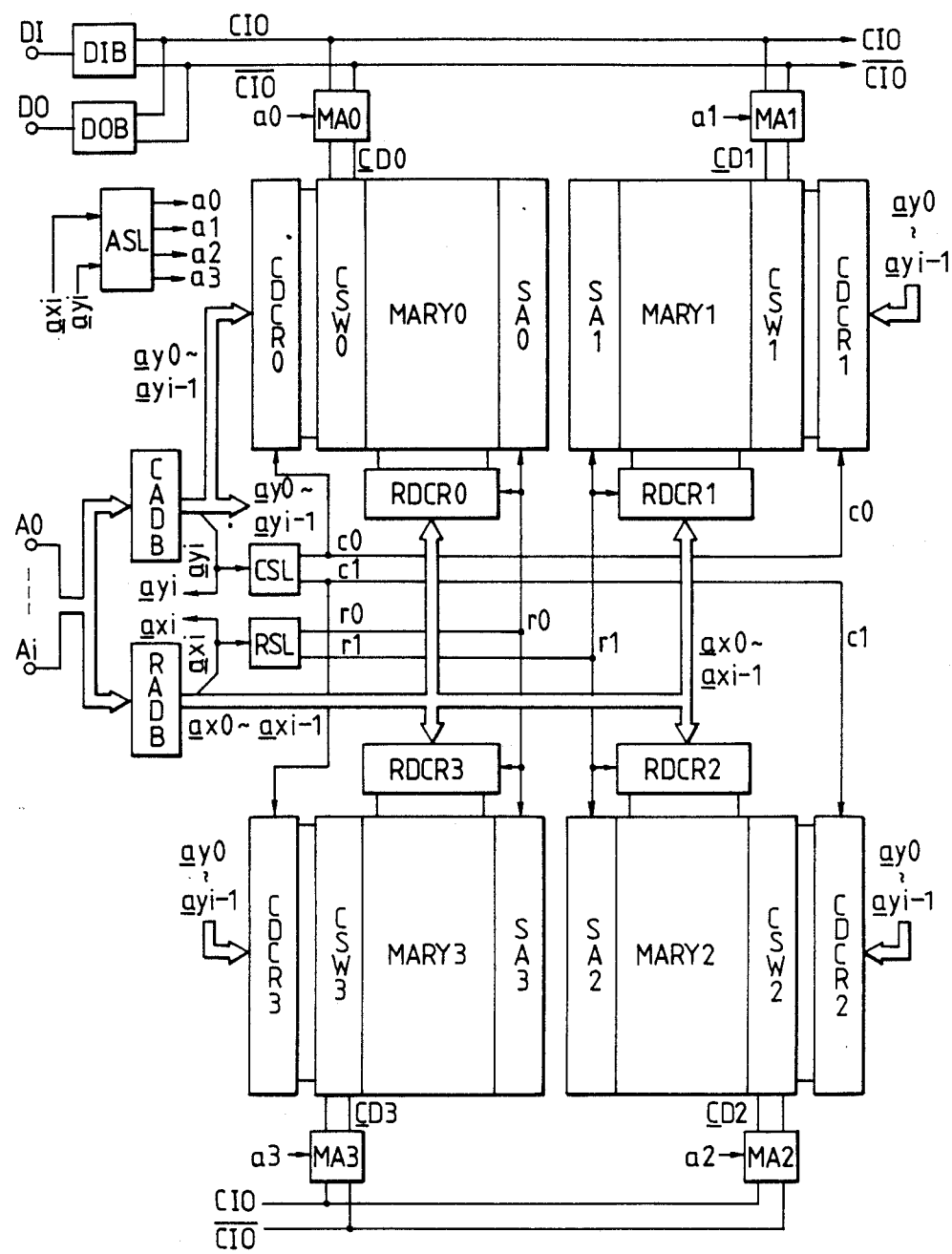
FIG. 3 is a block diagram of the dynamic RAM examined by the present invention.

In accordance with the embodiment described above, the operation of the column address decoder, too, is controlled by the row system address signal, not by the column system address signal. Accordingly, only the row address decoders and column address decoders corresponding to the memory mat (memory array) containing the memory cells to and from which the data input/output are to be made in the read and write operations are rendered operative. In the dynamic RAM shown in FIG. 3, on the other hand, not only the row address decoder RDCR1 but also the row address decoder RDCR2 are operated when the data input/output are made to and from the memory cell in the memory array MARY1, for example. Therefore, the selection operation of the word lines in the memory array MARY2 and the operation of the sense amplifier group SA2 become necessary and power consumption becomes greater as much. The embodiment described above can prevent such an increase in power consumption.

As illustrated in the foregoing embodiments, the present invention provides the following effects when applied to a semiconductor memory device such as a dynamic RAM having a plurality of memory arrays.

(1) Lower power consumption of the dynamic RAM can be accomplished by operating selectively the memory peripheral circuits disposed so as to correspond to a plurality of memory arrays, such as row address decoders, column address decoders, sense amplifiers and main amplifiers, in accordance with the common array selection signal generated by part of row address signals while unnecessary memory peripheral circuits are kept inoperative.

(2) The structure of the array selection circuit and its associated wirings can be simplified by operating or not operating the memory peripheral circuits such as the row address decoders, column address decoders, sense amplifiers and main amplifiers in accordance with the common array selection signal in the item (1) described above.

(3) The cost of production of the dynamic RAM having a plurality of memory arrays can be reduced due to the effect described in item (2).

Though the present invention has thus been described with some of its preferred forms, the invention is not particularly limited thereto but can of course be changed or modified in various manners without departing from the scope and spirt thereof. For example, in the embodiment shown in FIG. 1, the array selection signals a0-a3 need not always be generated on the basis of the upper 2-bit row address signals and the memory arrays and their peripheral circuit may be disposed in eight sets or more, for example. It is also possible to dispose a plurality of complementary input/output line sets, and a plurality of complementary common data lines and main amplifiers in such a manner as to correspond to each memory array so that a plurality of complementary data lines can be selected from each memory array and at the same time, memory data of a plurality of bits can be inputted and outputted. In the embodiment shown in FIG. 2, the memory peripheral circuits are divided on the basis of the column address decoder but they can be divided on the basis of the row address decoder, too. The array selection signals a0 and a1 need not always be generated on the basis of the row address signal of the uppermost order. The embodiments shown in FIGS. 1 and 2 may include a refresh address counter and an address multi-plexer for autonomically executing the refresh operation, and the block structure and the combinations of the address signals and control signals may assume various forms.

The foregoing description deals primarily with the application of the invention to the dynamic RAM as the background and field of utilization of the invention, but the present invention is not particularly limited thereto. For example, the present invention can be applied to various semiconductor memory devices such as a multi-port memory using the dynamic RAM as its basic constituent or a static RAM. In short, the present invention can be applied particularly effectively to a semiconductor memory including at least a plurality of memory arrays and a plurality of column address decoders and a digital apparatus incorporating therein such a semiconductor memory device.

The typical effect among those obtained by the invention disclosed herein is briefly as follows. Lower power consumption of a dynamic RAM can be accomplished by selectively operating memory peripheral circuits such as row address decoders, column address decoders, sense amplifiers and main amplifiers that are disposed in such a manner as to correspond to a plurality of memory arrays, in accordance with a common array selection signal generated on the basis of part of row address signals, and it becomes thus possible to simplify the memory peripheral circuits and to reduce the cost of production of the dynamic RAM.

What is claimed is:

1. A semiconductor memory device comprising:
a plurality of memory arrays;
array selection means for receiving a predetermined address signal and for selectively generating an array selection signal to select a predetermined one of said memory arrays;
row and column address decoders disposed in such a manner as to respectively correspond to said memory arrays;
a plurality of amplifiers disposed in such a manner as to respectively correspond to said memory arrays; and
selecting means for generating a signal to selectively operate, in accordance with said array selection signal, a predetermined one of said row address decoders corresponding to said selected memory array, a predetermined one of said column address decoders corresponding to said selected memory array, and a predetermined one of said amplifiers corresponding to said selected memory array.

2. A semiconductor memory device according to claim 1, wherein said semiconductor memory device is a dynamic RAM and wherein said amplifiers include sense amplifiers and main amplifiers disposed in such a manner as to correspond to said memory arrays and operated selectively in accordance with said array selection signal.

3. A semiconductor memory device according to claim 1, wherein said address signal is part of row address signals.

4. A semiconductor memory device comprising:
a plurality of memory arrays, each including a plurality of memory cells disposed in matrix;
a plurality of external terminals for address signals;
first and second control external terminals;
address signal generation means connected to said external terminals for address signals and to said first and second external terminals, for generating row address signals in accordance with address signals at said external terminals for said address signals in synchronism with a first strobe signal supplied thereto through said first control external terminal, and for generating column address signals in accordance with address signals at said external terminals for said address signals in synchronism with a second strobe signal supplied thereto through said second control external terminal;
a plurality of row address decoders disposed in such a manner as to correspond to said memory arrays, respectively, for selecting a plurality of memory cells designated by predetermined row address signals among said row address signals from said memory array corresponding thereto;
a plurality of column address decoders disposed in such a manner as to correspond to said memory arrays, respectively, for selecting a plurality of memory cells designated by said column address signals from said memory array corresponding thereto;
a plurality of main amplifiers disposed in such a manner as to respectively correspond to said memory arrays; and selection signal generation means for generating a selection signal for operating a predetermined row address decoder among said row address decoders, a predetermined column address decoder among said column address decoders and a predetermined main amplifier among said main amplifiers upon receiving at least part of row address signals among said row address signals.

5. A semiconductor memory device according to claim 4, wherein each of said memory cells includes a storage capacitor and a switch device for selecting the address.

6. A semiconductor memory device according to claim 5, wherein the same selection signal is supplied from said selection signal generation means to said row address decoder and said column address decoder that are to be operated.

7. A semiconductor memory device according to claim 6, wherein each of said column address decoder and said row address decoder includes a decoder circuit to which a power source voltage is selectively supplied in accordance with a selection signal supplied thereto.

8. A semiconductor memory device according to claim 6, wherein each of said column address decoders selects a plurality of memory cells from at least two memory arrays.

9. A semiconductor memory device according to claim 8, wherein said row address decoder is disposed in such a manner as to correspond to said memory array on the 1:1 basis.

10. A semiconductor memory device comprising:
a plurality of memory arrays;
array selection means for receiving a predetermined address signal and for selectively generating an array selection signal to select a predetermined one of said memory arrays;
row and column address decoders disposed in such a manner as to respectively correspond to said memory arrays;
a plurality of amplifiers disposed in such a manner as to respectively correspond to said memory arrays; and
selecting means for generating a signal to selectively operate, in accordance with said array selection signal, a predetermined one of said row address decoders corresponding to said selected memory array, a predetermined one of said column address decoders corresponding to said selected memory array, and a predetermined one of said amplifiers corresponding to said selected memory array so that only said predetermined row address decoder, said predetermined column address decoder and said predetermined amplifier are operated while row address decoders, column address decoders and amplifiers corresponding to non-selected memory arrays are not operated.

11. A semiconductor memory device according to claim 10, wherein said semiconductor memory device is a dynamic RAM and wherein said amplifiers include sense amplifiers and main amplifiers disposed in such a manner as to correspond to said memory arrays and operated selectively in accordance with said array selection signal.

12. A semiconductor memory device according to claim 10, wherein said address signal is part of row address signals.

* * * * *